Figure 1:
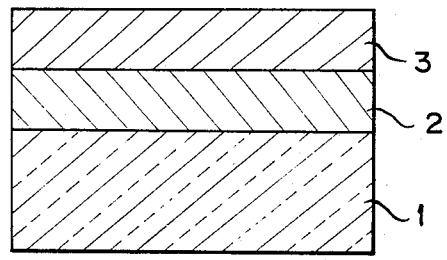

United States Patent [19]

Hatano et al.

[11] Patent Number: 4,497,878
[45] Date of Patent: Feb. 5, 1985

[54] PHOTOMASK MATERIAL

[75] Inventors: Takashi Hatano; Akira Maruyama, both of Hino, Japan

[73] Assignee: Konishiroku Photo Industry Co., Ltd., Tokyo, Japan

[21] Appl. No.: 405,724

[22] Filed: Aug. 6, 1982

[30] Foreign Application Priority Data

Aug. 19, 1981 [JP] Japan ............................ 56-130460

[51] Int. Cl.³ .................... B32B 15/04; B32B 15/00
[52] U.S. Cl. .................................... 428/698; 428/699; 428/701; 428/702; 430/5; 118/504; 118/505
[58] Field of Search ............ 428/698, 701, 702, 639, 428/469, 699; 427/126.3, 126.6; 430/5, 317, 318, 396; 118/504, 505; 156/656

[56] References Cited

U.S. PATENT DOCUMENTS 3,406,043 10/1958 Balde ........................... 428/698 X
3,907,620 9/1975 Abraham et al. ................ 427/82 X
4,284,687 8/1981 Dreyer et al. ................ 428/469 X

FOREIGN PATENT DOCUMENTS 17152 2/1980 Japan ................................ 430/6

Primary Examiner—Alexander S. Thomas
Attorney, Agent, or Firm—Frishauf, Holtz, Goodman & Woodward

[57] ABSTRACT

There is disclosed a photomask material comprising a substrate, and at least one layer containing mixture of a metal oxide and a metal nitride or at least one metal nitride layer provided on the substrate, and the photomask material may comprise a substrate and a mask layer provided on the substrate, the mask layer consisting of a layer containing a lower metal oxide and/or a lower metal nitride, and a layer containing a mixture of a higher oxide and a higher nitride of the same metal or a higher metal nitride layer of the same metal.

The photomask material of the present invention exhibits excellent resistance to the cleaning solutions and can be used repeatedly.

7 Claims, 1 Drawing Figure

PHOTOMASK MATERIAL

This invention relates to an improvement in the photomask material used in the production process for semiconductor devices or the like.

One of the most important processes in the production of semiconductor devices or the like is the formation of a fine pattern by the photoetching. Photomasks are essential to the process. Photomasks include two types, i.e., the emulsion masks and the hard masks. However, as a higher pattern density is needed recently, hard masks exhibiting excellent pattern sharpness, excellent line width reproducibility and few defects are widely used in the production process for semiconductor devices in which a higher density is needed.

Generally, the hard masks comprise thin films of chromium, chromium oxide, iron oxide and silicon provided on transparent substrates made of glass or the like. In the formation of a fine pattern by the photoetching, the pattern sharpness and line width reproducibility are adversely affected by the fact that the incident light for exposure is reflected by the surface of the silicon wafer and the reflected light is again reflected from the surface of the opaque section of the mask and again entered into the silicon wafer. To prevent this phenomenon, the so-called low-refection type chromium masks comprising a chromium oxide film superimposed on metallic chromium are widely used.

On the other hand, unlike the emulsion masks, the hard masks are advantageous in that they can be reused by washing them even when they are stained during their use. Particularly, strong acid such as hot concentrated sulfuric acid are generally used to remove a photoresist attached when a pattern is transferred to a silicon wafer by contact printing. Therefore, the photomasks must withstand the strond acid.

However, the conventional masks formed by stacking metallic chromium and chromium oxide layers exhibit a low resistance to strong acids, and their repeated use is limited. Further, the conventional masks do not exhibit sufficient etching characteristics needed by photomasks for use in the preparation of fine patterns. This is because metallic chormium and chromium oxide have different etching speeds with respect to an etching solution. In addition, with the conventional masks, the resist adhesion is insufficient, and a sufficient dimensional accuracy cannot be obtained when forming a fine pattern.

The primary object of the present invention is to provide a photomask material resisting to a strong acid cleaning solution, which is used for repeated use of the photomask material, and suitable for repeated use.

Another object of the present invention is to provide a photomask material for preparing fine patterns.

The present invention relates to a photomask material comprising a substrate provided with layers containing metal oxides whose oxidation conditions are different and/or metal nitrides whose nitriding conditions are different. Further, the present invention relates to a photomask material comprising a substrate on which at least one layer containing a mixture of a metal oxide and a metal nitride or at least one metal nitride layer is directly or indirectly formed.

Namely, a photomask material of the present invention comprises a substrate, and at least one layer containing a mixture of a metal oxide and a metal nitride or at least one metal nitride substrate provided on said layer.

Further, the photomask material of the present invention may comprise a substrate and a mask layer provided on said substrate, in which said mask layer consists of a layer containing a lower metal oxide and/or a lower metal nitride, and a layer containing a mixture of a higher oxide and a higher nitride of the same metal or a layer containing a higher metal nitride of the same metal.

FIG. 1 is a sectional view showing the low-reflection chromium mask in accordance with the present invention.

In the present invention, the metal oxides mean those having an element ratio of metal to oxygen between 99:1 and 30:70. Metal oxide having a higher oxygen ratio are called the higher metal oxides, and those having a lower oxygen ratio are called the lower metal oxides. Namely, the higher metal oxides have an element ratio of metal to oxygen between 50:50 and 30:70 (inclusive, respectively), and the lower metal oxides have an element ratio of metal to oxygen between 99:1 (inclusive) and 50:50 (exclusive).

The metal nitrides in the present invention have an element ratio of metal to nitrogen between 99:1 and 30:70. Metal nitrides having a higher nitrogen ratio are called the higher metal nitrides, and those having a lower nitrogen ratio are called the lower metal nitrides. The higher metal nitrides have an element ratio of metal to nitrogen between 75:25 and 30:70 (inclusive, respectively), and the lower metal nitrides have an element ratio of metal to nitrogen between 99:1 (inclusive) and 75:25 (exclusive).

As described above, the photomask material in accordance with the present invention contains a metal nitride or a mixture of a metal nitride and a metal oxide. Therefore, the photomask material in accordance with the present invention exhibits an excellent resistance to acids and allows uniform etching.

The photomask material in accordance with the present invention is obtained by forming a layer 2 (in FIG. 1) containing a lower metal oxide and/or a lower metal nitride on a substrate 1, and stacking a layer 3 containing a mixture of a higher oxide and a higher nitride of the same metal or containing a higher metal nitride of the same metal.

The aforesaid substrate is not only transparent visually but also permeable to electromagnetic waves used for exposure, for example, X-rays. A transparent intermediate layer may be formed on the substrate. In the present invention, metals which are converted into oxides and nitrides soluble in an etching solution, such as chromium, titanium, molybdenum, tantalum and tungsten, are used. Particularly, oxide and nitride of chromium are preferable. The metal oxides and nitrides can be formed on the substrate by a known procedure, for example by sputtering a metal in an atmosphere of argon, oxygen or nitrogen gas.

When a layer containing a mixture of an oxide and a nitride is formed on the substrate, a layer containing a mixture of a higher oxide and a higher nitride may be formed adjacent to the substrate, and then a layer of a lower oxide or a lower nitride may be formed on the mixture layer thus formed. Or, after the aforesaid mixture layer is formed, a layer containing a mixture of a higher oxide and a higher nitride may be formed on the mixture layer. Alternatively, a layer containing a lower oxide and/or a lower nitride may be formed as the lowermost layer, and a layer containing a mixture of a higher oxide and a higher nitride may be stacked on the lowermost layer. Further, the same technical effect can be obtained also when the aforesaid layer containing a mixture of an oxide and a nitride may be formed via a transparent intermediate layer on the substrate.

The photomask material in accordance with the present invention comprises a mixture layer in which the degrees of oxidation and nitriding of the same metal differ is stacked on the substrate. Therefore, the photomask material in accordance with the present invention exhibits excellent resistance to the cleaning solutions and can be used repeatedly. Further, the photomask material can be used without changing the etching treatment and etching conditions. In addition, the photomask material exhibits excellent etching characteristics and can be adapted to fine patterns.

The present invention is hereinafter illustrated in further detail by the following nonlimitative examples.

EXAMPLE 1

A layer containing a mixture of chromium oxide in which the element ratio of chromium oxygen was 85:15 and chromium nitride in which the element ratio of chromium to nitrogen was 90:10 was formed to a thickness of 1000 Å on a glass substrate. When the film thus formed was dipped in concentrated sulfuric acid at 120° C. for one hour, no reduction in film thickness was observed. Further, when this film was etched with a ceric nitrate-based etching solution, the etching speed was about 27 Å/sec. The degree of protrusion-recession of the pattern edge was ±0.02 μm or less, and the degree of side etching by 10 sec. over-etching was 0.06 μm.

EXAMPLE 2

A layer containing a mixture of chromium oxide in which the element ratio of chromium oxygen was 40:60 and chromium nitride in which the element ratio of chromium to nitrogen was 50:50 was formed to a thickness of 600 Å on a glass substrate. When the film thus formed was dipped in concentrated surfric acid at 120° C. for one hour, no reduction in film thickness was observed. Further, when this film was etched with a ceric nitrate-based etching solution, the etching speed was about 28 Å/sec. The degree of protrusion-recession of the pattern edge was ±0.02 μm or less, and the degree of side etching by 10 sec. over-etching was 0.05 μm.

EXAMPLE 3

A layer containing a mixture of chromium oxide in which the element ratio of chromium to oxygen was 85:15 and chromium nitride in which the element ratio of chromium to nitrogen was 90:10 was formed to a thickness of 800 Å on a glass substrate. Then, a layer containing a mixture of chromium oxide in which the element ratio of chromium to oxygen was 40:60 and chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 43 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small. ($\delta \leq 0.1$ μm)

From the Table 1 shown below, it is clear that the above-mentioned results are obtained also when the same mixture layer as the uppermost layer is provided as the first layer.

TABLE 1

| | Present invention | | Conventional technique | |
| --- | --- | --- | --- | --- |
| | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 27 | 28 | 30 | 15 |

As described above, when a layer containing a mixture of a lower chromium oxide and a lower chromium nitride is combined with a layer containing a mixture of a higher chromium oxide and a higher chromium nitride, a low-reflection chromium mask exhibiting an excellent resistance to acids and excellent etching characteristics and capable of being treated by the same methods and under the same conditions as the conventional technique is obtained.

EXAMPLE 4

A layer containing chromium oxide in which the element ratio of chromium to oxygen was 90:10 was formed to a thickness of 800 Å on a glass substrate. Then, a layer containing a mixture of chromium oxide in which the element ratio of chromium to oxygen was 40:60 and chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 40 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small ($\delta \leq 0.1$ μm)

From the Table 2 shown below, it is clear that the above-mentioned results are obtained also when the same mixture layer as the uppermost layer is provided as the first layer.

TABLE 2

| | Present invention | | Conventional technique | |
| --- | --- | --- | --- | --- |
| | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 29 | 28 | 30 | 15 |

As described above, when a layer containing a lower chromium oxide is combined with a layer containing a mixture of a higher chromium oxide and a higher chromium nitride, a low-reflection chromium mask exhibiting an excellent resistance to acids and excellent etching characteristics and capable of being treated by the same methods and under the same conditions as the conventional technique is obtained.

EXAMPLE 5

A layer containing chromium nitride in which the element ratio of chromium to nitrogen was 85:15 was formed to a thickness of 800 Å on a glass substrate. Then, a layer containing a mixture of chromium oxide in which the element ratio of chromium to oxygen was 40:60 and chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 48 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small. ($\delta \leq 0.01$ μm)

From the Table 3 shown below, it is clear that the above-mentioned results are obtained also when the same mixture layer as the uppermost layer is provided as the first layer.

TABLE 3

|  | Present invention | | Conventional technique | |
| --- | --- | --- | --- | --- |
|  | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 30 | 28 | 30 | 15 |

As described above, when a layer containing a lower chromium nitride is combined with a layer containing a mixture of a higher chromium oxide and a higher chromium nitride, a low-reflection chromium mask exhibiting an excellent resistance to acids and excellent etching characteristics and capable of being treated by the same methods and under the same conditions as the conventional technique is obtained.

EXAMPLE 6

A layer containing chromium oxide in which the element ratio of chromium to oxygen was 90:10 was formed to a thickness of 800 Å on a glass substrate. Then, a layer containing chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 40 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small. ($\delta \leq 0.1$ μm)

From the Table 4 shown below, it is clear that the above-mentioned results are obtained also when the same mixture layer as the uppermost layer is provided as the first layer.

TABLE 4

|  | Present invention | | Conventional technique | |
| --- | --- | --- | --- | --- |
|  | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 29 | 31 | 30 | 15 |

As described above, when a layer containing a lower chromium oxide is combined with a layer containing a higher chromium nitride, a low-reflection chromium mask exhibiting an excellent resistance to acids and excellent etching characteristics and capable of being treated by the same methods and under the same conditions as the conventional technique is obtained.

EXAMPLE 7

A layer containing a mixture of chromium oxide in which the element ratio of chromium to oxygen was 85:15 and chromium nitride in which the element ratio of chromium to nitrogen was 90:10 was formed to a thickness of 800 Å on a glass substrate. Then, a layer containing chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 40 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small. ($\delta \leq 0.1$ μm)

From the Table 5 shown below, it is clear that the above-mentioned results are obtained also when the same mixture layer as the uppermost layer is provided as the first layer.

TABLE 5

|  | Present invention | | Conventional technique | |
| --- | --- | --- | --- | --- |
|  | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 27 | 31 | 30 | 15 |

As described above, when a layer containing a mixture of a lower chromium oxide and a lower chromium nitride is combined with a layer containing a higher chromium nitride, a low-reflection chromium mask exhibiting an excellent resistance to acids and excellent etching characteristics and capable of being treated by the same methods and under the same conditions as the conventional technique is obtained.

EXAMPLE 8

A layer containing chromium nitride in which the element ratio of chromium to nitrogen was 85:15 was formed to a thickness of 800 Å on a glass substrate. Then, a layer containing chromium nitride in which the element ratio of chromium to nitrogen was 50:50 was formed to a thickness of 300 Å on the previously formed layer.

When the two-layer film thus formed was etched with a ceric nitrate-based etching solution, the etching completion time was 44 sec. The degree of protrusion-recession of the pattern edge was ±0.03 μm or less, and the degree of the side etching by 10 sec. over-etching was 0.1 μm. Further, when the mask after patterning was dipped in concentrated sulfuric acid at 120° C. for one hour, no change was observed in the transmission and pattern shape. The adhesion to a resist was satisfactory, and the fluctuation in the pattern line width was very small. ($\delta \leqq 0.01$ μm)

From the Table 6 shown below, it is clear that the above-mentioned results are obtained also when the same mixture layer as the uppermost layer is provided as the first layer.

TABLE 6

|  | Present invention | | Conventional technique | |
| --- | --- | --- | --- | --- |
|  | Lower layer | Upper layer | Chromium oxide | Completely oxidized chromium |
| Dissolving speed with hot conc. sulfuric acid | 27 Å/hr or less | 20 or less | 30,000 | 1,200 |
| Etching speed | 30 | 31 | 30 | 15 |

As described above, when a layer containing a lower chromium nitride is combined with a layer containing a higher chromium nitride, a low-reflection chromium mask exhibiting an excellent resistance to acids and excellent etching characteristics and capable of being treated by the same methods and under the same conditions as the conventional technique is obtained.

The masks thus formed can be washed many times with a strong acid and damage of the mask due to cleaning is minimized. Therefore, the yield of the product is improved and the cost can be reduced. Thus the present invention is practically extremely useful.

We claim:

1. A photomask material comprising a substrate and a mask layer provided on said substrate, said mask layer consisting of a layer containing a lower metal oxide, a lower metal nitride or a combination of said lower metal oxide and said lower metal nitride, and a layer containing a mixture of a higher metal oxide and a higher metal nitride of the same metal or a layer containing a higher metal nitride of the same metal.

2. The photomask material of claim 1, wherein said lower metal oxide has an element ratio of metal to oxygen between 99:1 (inclusive) and 50:50 (exclusive).

3. The photomask material of claim 1, wherein said lower metal nitride has an element ratio of metal to nitrogen between 99:1 (inclusive) and 75:25 (exclusive).

4. The photomask material of claim 1, wherein said higher metal oxide has an element ratio of metal to oxygen between 50:50 and 30:70 (inclusive, respectively).

5. The photomask material of claim 1, wherein said higher nitride has an element ratio of metal to nitrogen between 75:25 and 30:70 (inclusive, respectively).

6. The photomask material of any of claims 1 to 5, wherein the metal is at least one selected from the group consisting of chromium, titanium, molybdenum, tantalum and tungsten.

7. The photomask material of claim 6, wherein said metal is chromium.

* * * * *